(12) United States Patent
Tsuji

(10) Patent No.: US 6,603,404 B1
(45) Date of Patent: Aug. 5, 2003

(54) LIGHT EMITTING DISPLAY DEVICE AND METHOD OF MAKING THE SAME

(75) Inventor: Kazuyoshi Tsuji, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 184 days.

(21) Appl. No.: 09/699,630

(22) Filed: Oct. 31, 2000

(30) Foreign Application Priority Data

Nov. 1, 1999 (JP) .............................................. 11-311701
Jan. 31, 2000 (JP) ....................................... 2000-022823
May 25, 2000 (JP) ....................................... 2000-154463

(51) Int. Cl.[7] .............................................. G08B 5/00
(52) U.S. Cl. .............................. 340/815.4; 340/815.44; 340/815.45; 340/815.49; 340/332
(58) Field of Search .............................. 340/332, 815.4, 340/815.44, 815.45, 815.49; 313/495; 353/99; 362/249; 40/452

(56) References Cited

U.S. PATENT DOCUMENTS

| | | | |
|---|---|---|---|
| 4,542,317 A | * 9/1985 | Morimoto et al. | 313/496 |
| 4,846,184 A | * 7/1989 | Comment et al. | 600/306 |
| 4,989,167 A | * 1/1991 | Kapec et al. | 361/681 |
| 5,477,394 A | * 12/1995 | Shibazaki | 359/858 |
| 5,495,306 A | * 2/1996 | Shibazaki | 353/99 |
| 5,499,067 A | * 3/1996 | Shibazaki | 353/99 |
| 5,694,190 A | * 12/1997 | Matsumoto et al. | 349/151 |
| 5,703,837 A | * 12/1997 | Umemoto et al. | 368/88 |
| 5,905,335 A | * 5/1999 | Fushima et al. | 313/495 |
| 6,097,351 A | * 8/2000 | Nishida | 345/1 |
| 6,140,761 A | * 10/2000 | Fushima et al. | 313/495 |

* cited by examiner

Primary Examiner—Daryl Pope
(74) Attorney, Agent, or Firm—Michael D. Bednarek; Shaw Pittman LLP

(57) ABSTRACT

A light emitting display device is provided which can be manufactured from a leadframe and which may be mounted with other such light emitting display devices in close side-by-side relationship. The light emitting display device includes a casing (3) of a predetermined height having an obverse surface formed with a plurality of display segments (4a, 4b) each of which is provided at an end of a light guide (41). A plurality of light emitting elements (2) are disposed in the casing so as to positionally correspond to the display segments. Each of plural leads (1) has a first end (11) electrically connected to a respective light emitting element (2) and a second end (12) extending toward a bottom side of the casing. A resin (6) is filled in the light guides (41) for sealing the first ends (11) of the leads and the light emitting elements (2). The second end (12) of each lead is formed with a soldering surface (B) which is provided in the casing (3) to be substantially flush with a bottom surface of the casing in the height direction of the casing.

17 Claims, 13 Drawing Sheets

FIG. 12a
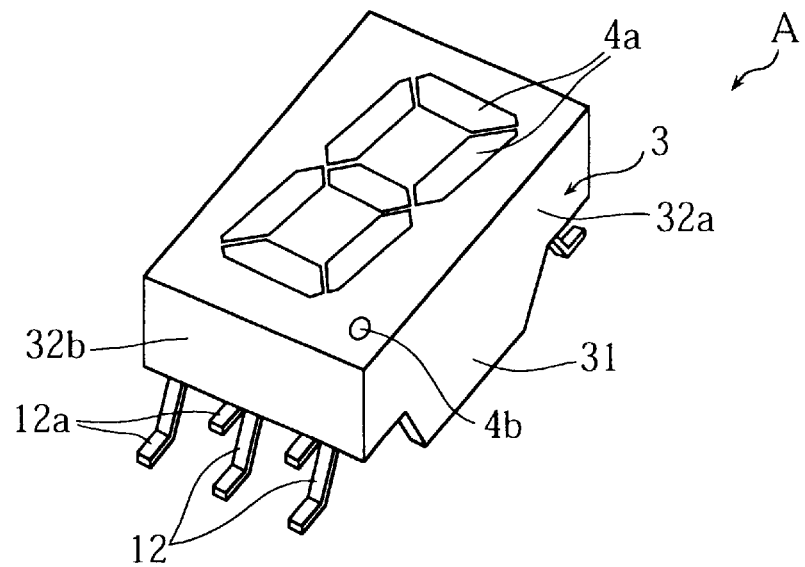
FIG. 12b
FIG. 12c
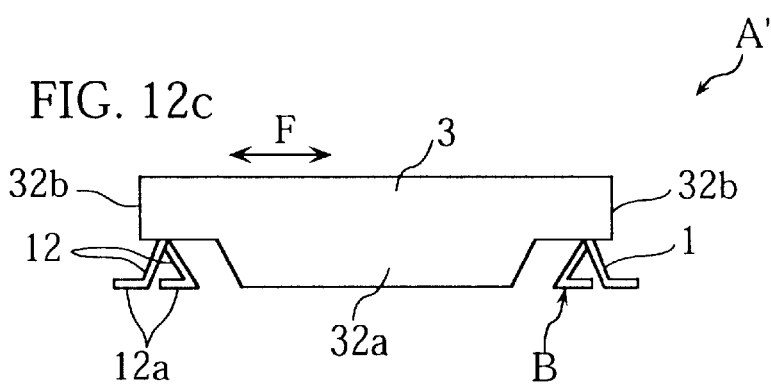

LIGHT EMITTING DISPLAY DEVICE AND METHOD OF MAKING THE SAME

TECHNICAL FIELD

The present invention relates to a light emitting display device for displaying a number or a letter by selectively lighting a plurality of light emitting portions provided on its display surface. It also relates to a method of making such a light emitting display device. Examples of such light emitting display device include a so-called eight segments light emitting display device including seven light emitting segments in the form of a bar arranged to form a number "8", and one dot segment for displaying a decimal point. Further, there exists a so-called dot matrix light emitting display device in which a plurality of dot segments are arranged in a matrix.

BACKGROUND ART

An example of prior art light emitting display device is shown in FIG. 16. The light emitting display device includes a casing 3 having an obverse surface which is formed with eight light emitting portions 4 comprising seven bar segments and one dot segment. Each of the light emitting portions 4 comprises a light guide perforated through the casing 3 in the height direction of the casing and a light emitting element such as an LED arranged at the bottom of the light guide. The light emitting display device further includes a plurality of leads, and each of the LEDs is bonded at a first end of one lead and is wire-bonded to a first end of another lead. Each of the leads has a second end, and the second ends extend along opposite side surfaces of the casing 3 toward the reverse side of the casing 3. In this way, each of the LEDs is electrically connected to an anode lead and a cathode lead. At this time, one of the anode and the cathode of each LED can be common with another LED. Therefore, in the case of eight segments light emitting display device as shown in FIG. 16, at least nine leads are provided to project from the reverse side of the casing 3.

Such a light emitting display device is formed using a so-called leadframe which includes lead portions. The LEDs are chip-bonded and wire-bonded on such a leadframe. Then a casing 3 is disposed over the leadframe so that each of light guides positionally corresponds to respective one of the LEDs. Then, after a tape is applied on the obverse surface of the casing 3 for prevention of resin flow, light-permeable resin is injected into the casing 3 from its reverse side and hardened. As a result, the light guides are filled with the light-permeable resin, and the first ends of the leads at which the LED chips and the wires are bonded are sealed with the light-permeable resin. Then, unnecessary portions of the leadframe are removed and the tape is peeled off, thereby providing a light emitting display device as shown in FIG. 16.

To display plural figures for example, a plurality of light emitting display devices need to be laterally aligned on a board without any space therebetween. Therefore, no leads can be extended out to the sides of the casing 3. This is because the leads 1 are extended vertically straight from the reverse surface of the casing 3. Such a light emitting display device is mounted on a board which is formed with a plurality of holes in advance. Each of the leads 1 is inserted in a respective hole of the board, and is soldered at the reverse surface of the board. The casing 3 is formed with a leg 31 at each of its four corners. The legs 31 determine the height of the casing 3 relative to the board when the leads are inserted into the holes.

The light emitting display device having the structure described above has the following problems.

Specifically, mounting of such a light emitting display device on a board, which is performed by inserting leads 1 into the holes of the board, cannot be easily automated. Such a mounting method is complicated because it is difficult to position the plurality of leads relative to the holes of the board because the leads 1 hide behind the casing 3 and can not be seen from above. Further, if a lead 1 is bent even partially, insertion of the lead into a hole is impossible. Moreover, when each of the leads is appropriately cut in advance for adjusting its length, the cut-off piece may remain at the cutting end of the lead 1, which hinders insertion of the lead into the hole.

On the other hand, surface mounting using reflow soldering is known as an easier and more efficient method of mounting an electronic component on a board. A surface mounting type light emitting display device is disclosed in JP-A-11-135839, for example. In the disclosed device, a necessary number of LEDs are mounted on an insulating substrate which is formed with a predetermined wiring pattern and terminals electrically connected to the wiring pattern. A casing formed with segments which direct light from the LEDs to the outside is mounted on the substrate. However, the manufacturing process of such a light emitting display device is more complicated than the light emitting display device of a leadframe type shown in FIG. 16, and hence requires a high manufacturing cost.

DISCLOSURE OF THE INVENTION

An object of the present invention is to provide a light emitting display device which can be manufactured from a leadframe and which may be mounted with other such light emitting display devices in close side-by-side relationship. The present invention also relates to a method of making such a light emitting display device.

In accordance with a first aspect of the present invention, there is provided a light emitting display device comprising a casing of a predetermined height having an obverse surface formed with a plurality of display segments each of which is provided at an end of a light guide, a plurality of light emitting elements disposed in the casing so as to positionally correspond to the display segments, a plurality of leads each of which has a first end electrically connected to a respective light emitting element and a second end extending toward a bottom side of the casing, and a resin filled in the light guides for sealing the first ends of the leads and the light emitting elements.

The second end of each lead is formed with a soldering surface which is provided in the casing to be substantially flush with a bottom surface of the casing in the height direction of the casing.

Preferably, the bottom side of the casing may have a peripheral portion formed with a plurality of legs.

Preferably, each of the soldering surfaces may be formed by bending, at the bottom side of the casing, the second end of a respective lead extending in the height direction of the casing at an acute angle.

Preferably, the second end of each lead may be bent toward a center of the casing.

Preferably, a spacer may be interposed between the resin and the second end of each lead.

Preferably, the second end of each lead may be formed with a flat portion which is substantially flush with the bottom surface of the casing in the height direction of the casing, and the second end is bent to define an obtuse angle at one end of the flat portion and/or at the other end of the flat portion.

Preferably, the plurality of leads are arranged in two rows extending along opposite sides of the casing, and the leads in one of the rows positionally deviates from the leads in the other row in the direction in which the rows extend.

In accordance with a second aspect of the present invention, there is provided a light emitting display device comprising: a casing having a predetermined height, the casing including an obverse surface, two longitudinally extending side walls and two widthwise extending side walls, the obverse surface being formed with a plurality of display segments each of which is provided at an end of a light guide; a plurality of light emitting elements disposed in the casing so as to positionally correspond to the display segments; a plurality of leads each of which has a first end electrically connected to a respective light emitting element and a second end extending toward a bottom side of the casing; and a resin filled in the light guides for sealing the first ends of the leads and the light emitting elements; the light emitting display device being used in combination with other light emitting display device or devices arranged in side-by-side relationship.

The plurality of leads are arranged in two rows extending along the two widthwise extending side walls, the second end of each lead being formed with a soldering surface.

Preferably, the soldering surface may be substantially flush with a bottom surface of the casing in the height direction of the casing.

Preferably, the casing may be rectangular or substantially rectangular in plan view.

Preferably, each of the longitudinally extending side walls may be formed with a leg.

Preferably, the soldering surface may be formed by bending the second end of each lead.

Preferably, the soldering surface may be located slightly lower than a bottom surface of the casing.

Preferably, the soldering surface may be formed by bending the second end of each lead inwardly. A spacer may be interposed between the resin and the second end of each lead.

Preferably, the leads may be bent so that portions of the leads extending outward from the resin are inclined alternately in opposite directions.

In accordance with a third aspect of the present invention, there is provided a method of making a light emitting display device comprising: a casing of a predetermined height having an obverse surface, two longitudinally extending side walls and two widthwise extending side walls, the obverse surface being formed with a plurality of display segments each of which is provided at an end of a light guide; a plurality of light emitting elements disposed in the casing so as to positionally correspond to the display segments; a plurality of leads each of which has a first end electrically connected to a respective light emitting element and a second end extending toward a bottom side of the casing; and a resin filled in the light guides for sealing the first ends of the leads and the light emitting elements.

The method comprises the steps of:
(a) bonding the light emitting elements on a leadframe including the leads and performing wire-bonding;
(b) disposing the casing on a leadframe so that the display segments positionally correspond to the light emitting elements;
(c) injecting a transparent resin into the casing for filling the light guides and solidifying the resin for sealing the first ends of the leads, the light emitting elements and bonding wires; and
(d) separating the leads from the leadframe and bending the second end of each lead for forming a soldering surface.

Preferably, in the step (d), the soldering surface is formed to be substantially flush with a bottom surface of the casing in the height direction of the casing.

Other features and advantages of the present invention will become clearer from the description of embodiments given below with reference to the accompanying drawings.

BRIEF DESCRIPTION OF THE DRAWINGS

FIG. 1a is an overall perspective view, FIG. 1b is a perspective view as viewed from the rear side of the device, and FIG. 1c is a sectional view.

FIG. 6a is an overall perspective view, FIG. 6b is a perspective view as viewed from the reverse side of the device, and FIG. 6c is a sectional view taken along lines C—C in FIG. 6a.

FIGS. 12a~12c illustrate another embodiment of light emitting display device according to the present invention; FIG. 12a is an overall perspective view, FIG. 12b is a perspective view as viewed from the reverse side of the device, and FIG. 12c is a side view.

FIG. 13a is an overall perspective view, FIG. 13b is a perspective view as viewed from the reverse side of the device, and FIG. 13c is a side view.

BEST MODE FOR CARRYING OUT THE INVENTION

Preferred embodiments of the present invention will be described below with reference to the accompanying drawings. Throughout the drawings, identical or similar elements or members are designated by the same reference signs.

Figure 1A:
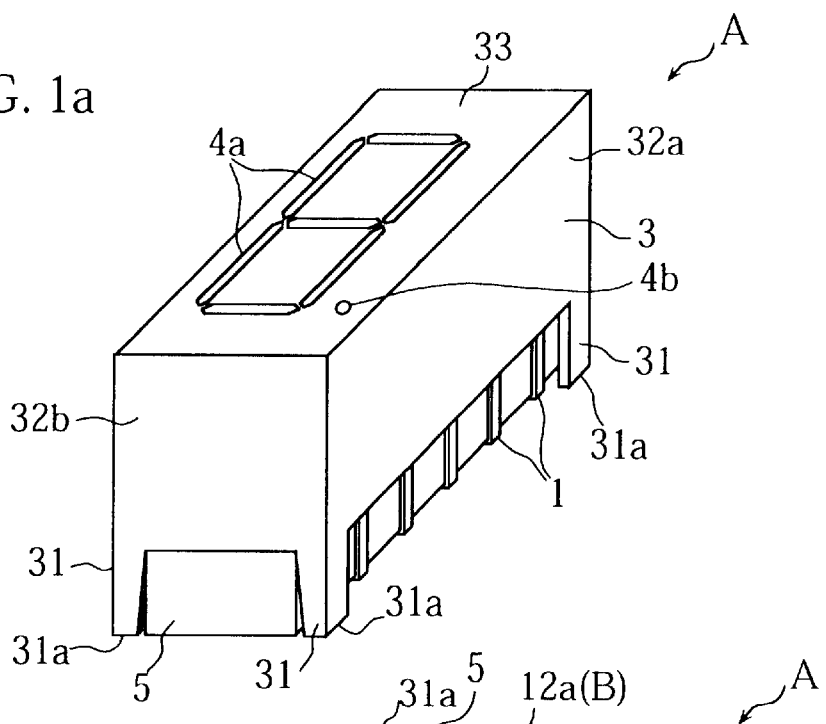
FIGS. 1a~1c illustrate an embodiment of a light emitting display device according to the present invention.
Figure 1B:
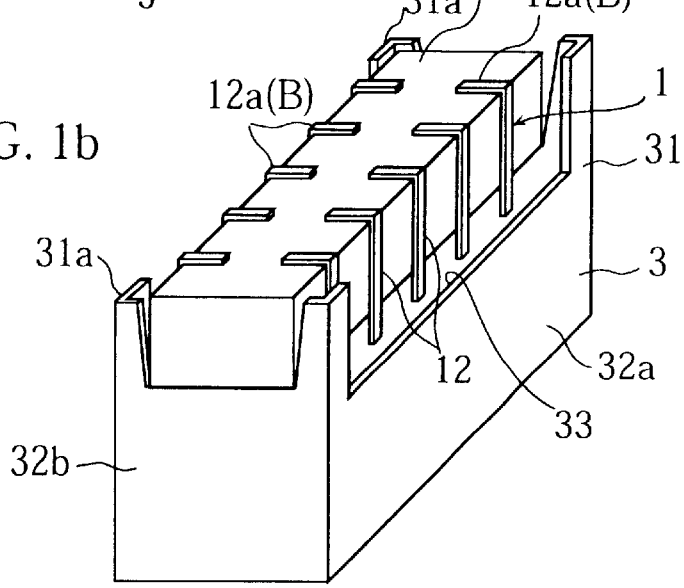
Figure 1C:
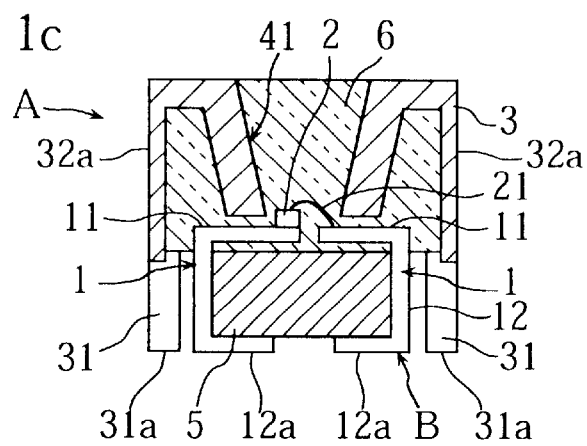

FIGS. 1a~1c illustrate a light emitting display device A in accordance with a first embodiment of the present invention. The light emitting display device comprises a casing 3 and a plurality of leads 1 extending out at the rear side of the casing. The casing 3 is a downwardly open box which includes an elongate rectangular display surface 33 and four side walls 32a, 32b extending downwardly from the four sides of the display surface 33, respectively. The casing 3 is formed with a leg 31 at each of the lower four corners. The four legs 4 are equal in height and have bottom surfaces 31a which define the bottom surface of the casing. The casing 3 may be formed by molding white heat-resistant resin having a good light reflectance.

The display surface 33 of the casing 3 is formed with a plurality of light emitting portions 4a, 4b. In the present embodiment, a so-called eight-segment display device is provided in which seven display segments 4a are bars arranged so as to define a numeral "8", and one display segment 4b is a dot for display of a decimal point.

Specifically, as clearly shown in FIG. 1c, each of the display segments 4a, 4b comprises a light guide 41 penetrating through the casing 3 to have an upper opening at the display surface 33 and filled with light-permeable resin 6, and an LED chip 2 arranged at the bottom of the light guide 41 as a light emitting element. Light emitted from the LED chip 2 travels through the light-permeable resin 6 and emitted to the outside at the respective display segment 4a, 4b. As a result, the display segment 4a, 4b is held illuminated when viewed from the outside.

The LED chips 2 are electrically connected to first ends 11 of the leads 1, respectively. Specifically, each of the LED chips 2 is bonded directly on a first end 11 of a lead 1 and is wire-bonded to a first end 11 of another lead 1. The leads 1 are obtained from a leadframe, and the first ends 11 of the leads extend horizontally under the light guides 41. Each of the leads 1 is bent, at a portion adjacent a corresponding side wall of the casing 3, substantially vertically so as to extend downwardly. The downwardly extending portion serves as a second end 12 of the lead 1. To provide an eight-segment display device, eight LED chips need to be provided in corresponding relationship to the display segments 4a, 4b. Each of the LED chips needs to be electrically connected to an anode lead and a cathode lead. One of the anode lead and the cathode lead may be commonly usable for other LED chips. Therefore, there must beat least a nine leads 1 to provide a corresponding number of second ends 12. In the illustrated embodiment, ten leads 1 are extended out of the casing 3 to provide ten second ends 12 arranged in two rows extending along and inwardly from the widthwise opposite side walls 32a of the casing 1, each row including five second ends.

The horizontal first ends 11 of the leads 1, the LED chips 2 bonded on the first ends, and the bonding wires 21 are sealed in the light-permeable resin 6 which is filled in the light guides 41. The second ends 12 of the leads 1 project downwardly from the lower surface of the light-permeable resin 6.

The second end 12 of each lead 1 is formed with a soldering surface B which is located substantially flush with the bottom surface of the casing 1 defined by the bottom surfaces 31a of the legs 31. The soldering surface B may have any configuration which is suitable for soldering onto a board by reflow soldering. In the present embodiment, the vertically extending second end 12 of each lead is bent perpendicularly inward to provide a horizontally extending bend 12a. The lower surface of the bend serves as the soldering surface B.

As shown in FIG. 1c, a spacer 5 is interposed between the lower surface of the light-permeable resin 6 and the bend 12a of each lead 1. The spacer 5 maybe a parallelepiped block formed of a resin. The spacer 5 has a width which corresponds to the distance between two opposite rows of the leads facing widthwise of the casing 3 and has a height which corresponds to the value obtained by subtracting the thickness of the lead 1 from the distance between the lower surface of the light-permeable resin and the bottom surface 31a of each leg 31. The provision of the spacer 5 facilitates forming the bend 12a of the lead 1. Further, when the light emitting display device is mounted on a board, the spacer provides high rigidity against a lateral external force on the casing 3, which contributes to stable mounting of the light emitting display device A on the board. Moreover, if the spacer 5 is made of a light-permeable, or light-reflective or light-absorbing material, it prevents light leakage at the rear side of the casing, so that light from the LED chips 2 can be efficiently utilized.

The light emitting display device described above with reference to FIGS. 1a~1c may be manufactured in the following manner.

Firstly, a leadframe is prepared which includes groups of leads 1 which provide horizontal first ends 11 and vertical second ends 12. Each group of leads 1 is allocated to one light emitting display device, and a plurality of such lead groups repeat longitudinally of the leadframe. While transferring the leadframe, LED chips are mounted on and wire-bonded to the first ends 11 of the leads, thereby connecting each LED chip to an anode and a cathode. Then, a casing 3 having the structure described above is disposed over each group of leads allocated to one light emitting display device. Then, after a tape is applied onto the front surface of the casing 3 for prevention of resin leakage and the leadframe is turned over, a predetermined amount of light-permeable resin 6 in a fluid state is injected into the casing 3 and hardened. In the case where the resin is a thermosetting resin, it may be hardened by heating. In the case where the resin is an ultraviolet curing resin, it may be hardened by ultraviolet irradiation. As a result, the light guides 41 formed in the casing 3 are filled with the light-permeable resin 6, and the first ends 11 of the leads 1, the LED chips 2 and the bonding wires 21 are sealed in the light-permeable resin 6. Then, the leads 1 are separated from the leadframe to provide an intermediate product of light emitting display device. Subsequently, after a spacer 5 is disposed between two opposite rows of leads facing each other widthwise of the casing 3, a second end 12 of each lead 1 is bent at a corner of the spacer 5, thereby providing a light emitting display device A as shown in FIGS. 1a~1c. Since the light emitting display device A can be made using the leadframe, the manufacturing steps are simplified, which leads to a cost reduction.

The light emitting display device A can be easily mounted on a board by so-called reflow soldering. Specifically, a board is used which is initially formed with conductor pads arranged so as to correspond to the soldering surfaces B of the leads 1. Solder paste is applied on each of the conductor pads by printing. After the light emitting display device A is positionally adjusted in a horizontal plane relative to the board A, the light emitting display device is placed on the board. Then, the board is put in a heating oven. As a result, the solvent in the solder paste is removed while the solder melts and solidifies for adhesion to each of the conductor pads on the board and to a corresponding soldering surface B of the lead. As a result, the soldering surface B of each lead 1 is electrically and mechanically connected to a corresponding conductor pad of the board.

As shown in FIGS. 1a~1c, each lead 1 and the soldering surface B of its second end 12 is located inwardly of the casing 3. Therefore, in mounting a plurality of light emitting display devices A, it is possible to arrange the devices laterally close to each other. When the light emitting display device is mounted on the board, the legs 31 of the casing 3 come into contact with the board. Therefore, an external force in the vertical direction is born by the board via the legs 31. As a result, it is possible to prevent deformation of the leads 1 which may cause a height variation of the casing 3 or breakage of the soldered portions, thereby increasing the mounting stability of the device. Further, since the spacer 5 disposed between the lower surface of the light-permeable resin 6 and the bent 12a of each lead provides a sufficient rigidity against a lateral external force applied to the casing 3, the mounting stability is further enhanced.

Instead of providing the soldering surface B by a right-angled bend at the second lead end 12 shown in FIGS. 1a~1c, the soldering surface B may be otherwise provided, as shown in FIGS. 2a~2g.

Figure 2A:
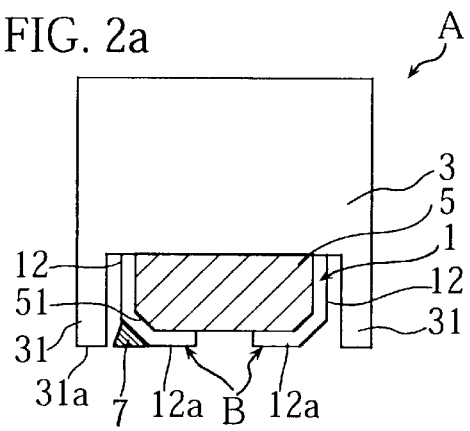
FIGS. 2a~2g illustrate modifications of the leads of the light emitting display device shown in FIGS. 1a~1c.

In the example shown in FIG. 2a, the vertically extending second end 12 of each lead 1 is bent inwardly at an angle of 45° and is bent again inwardly at the same angle, thereby forming a horizontal portion 12a. Each of opposite lower corners of the spacer 5 is chamfered to provide a bevel surface 51 for allowing such bending of the lead 1. In this structure having such a soldering surface B, each lead 1 is formed with a bevel portion which is continuous with the horizontal portion 12a. Therefore, it is possible to form a sufficient solder fillet 7, which enhances the soldering strength.

Figure 2B:
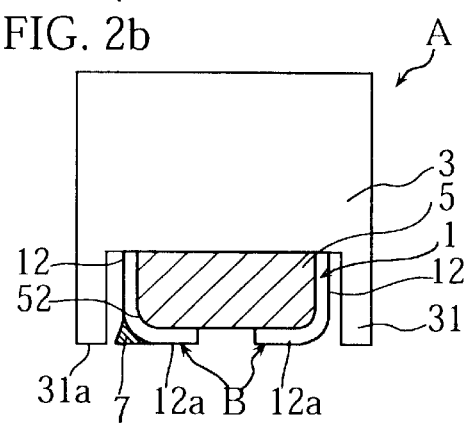

In the example shown in FIG. 2b, the vertically extending second end 12 of each lead 1 is roundedly curved inwardly to provide a horizontal portion 12a at its extremity. Each of opposite lower corners of the spacer 5 is curved to provide a curved portion 52 for allowing such bending of the lead 1. In this structure having such a soldering surface B, the second end 12 of each lead 1 is formed with a rounded portion which is continuous with the horizontal portion 12a. Therefore, it is possible to form a sufficient solder fillet 7, which enhances the soldering strength.

Figure 2C:
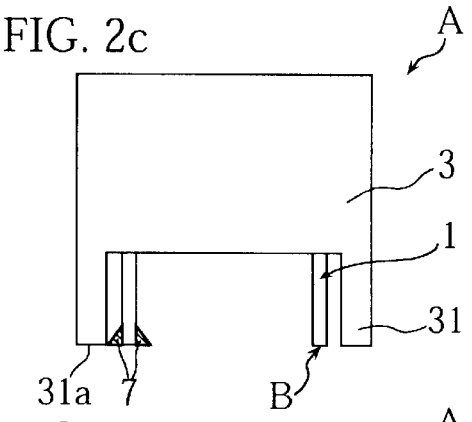

In the example shown in FIG. 2c, the second end 12 of each lead 1 remains as it is cut from the leadframe, and the cut surface serves as a soldering surface B. With this structure, it is possible to eliminate a step for bending the leads 1.

Figure 2D:
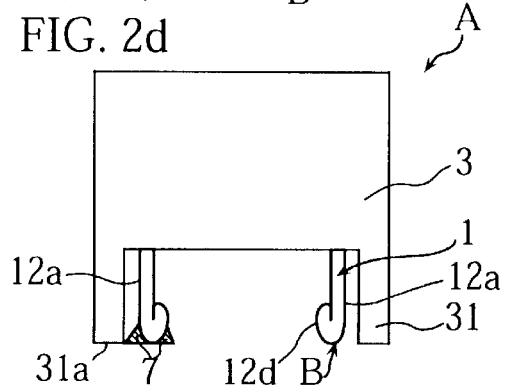

In the example shown in FIG. 2d, the second end 12 of each lead 1 is folded back inwardly to provide a bend 12d. The outer surface of the bend 12d serves as a soldering surface B. With such a structure, the outer surface of the bend 12d is rounded, which is advantageous in forming a solder fillet 7.

Figure 2E:
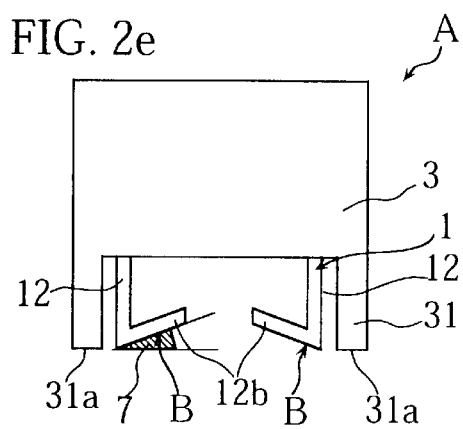

In the example shown in FIG. 2e, the vertically extending second end 12 of each lead 1 is bent inwardly at an acute angle to provide a bend 12b. The lower surface of the bend 12b serves as a soldering surface B. With such a structure, a wedge-shaped space is defined between the bend 12b and the board, so that a solder fillet 7 can be appropriately formed in this space.

Figure 2F:
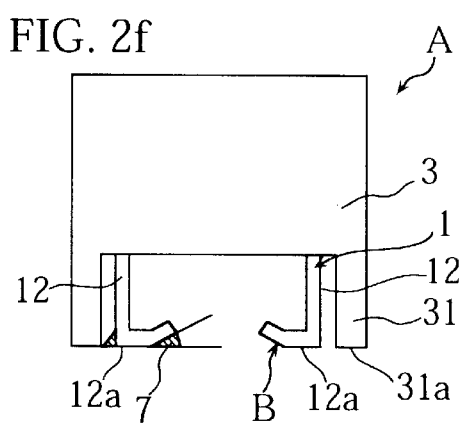

In the example shown in FIG. 2f, the second end 12 of each lead 1 is bent perpendicularly inwardly and is further bent upwardly at an obtuse angle. As a result, there is provided a horizontal portion 12a and an inclined portion 12b continuous with the horizontal portion 12a. The lower surfaces of the horizontal portion and the inclined portion serve as a soldering surface B. With such a structure, a wedge-shaped space is defined between the inclined portion 12b and the board, so that a solder fillet 7 can be appropriately formed in this space.

Figure 2G:
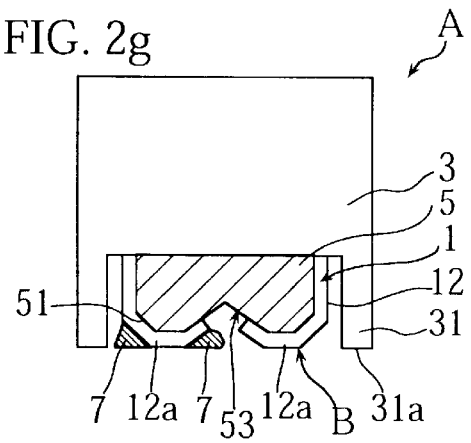

In the example shown in FIG. 2g, the second end 12 of each lead 1 is bent twice inwardly at an angle of 45° each time to provide a horizontal portion 12a and is further bent to be inclined upwardly. Each of opposite lower corners of the spacer 5 is chamfered to provide a bevel surface 51 for allowing such bending of the lead 1. Further, the spacer 5 is centrally formed with a V-shaped groove 53. With such a structure, an inclined portion and a wedge shaped space is formed at opposite ends of the horizontal portion 12a, so that sufficient solder fillets can be formed at such portions.

Although a spacer 5 is not illustrated in FIGS. 2e and 2f, such a spacer may be provided in correspondence with the bending shape of the leads 1.

Figure 3A:
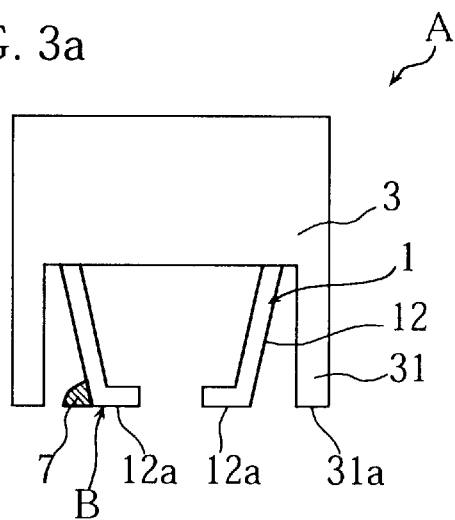
FIGS. 3a~3c illustrate other embodiments of light emitting display devices according to the present invention.
Figure 3B:
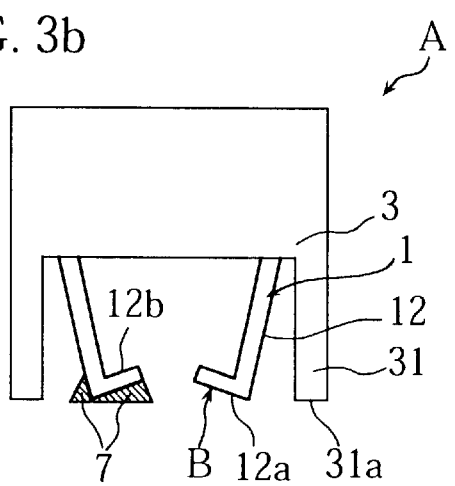
Figure 3C:
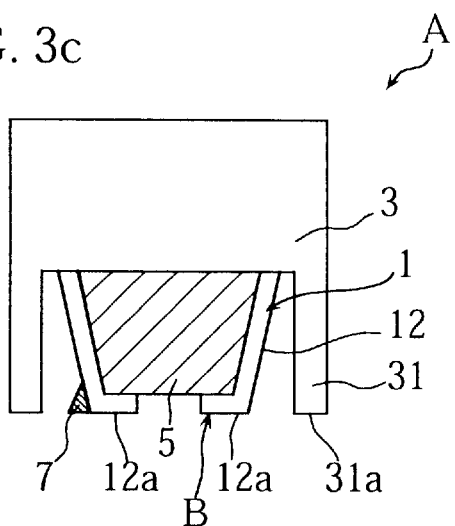

FIGS. 3a~3c illustrate other modifications of a soldering surface B formed at the second end 12 of each lead 1.

In the example shown in FIG. 3a, the second end 12 of each lead 1 extends obliquely inwardly from its root. The second end 12 is then bent inwardly to provide a horizontal portion 12a at its extremity. With such a structure, the horizontal portion 12a is located more inwardly with respect to the casing 3. Therefore, melt solder is unlikely to flow out of the casing 3 so that it is possible to avoid shorting while also avoiding adverse affects on the mounting of the adjacent light emitting display device.

In the example shown in FIG. 3b, the second end 12 of each lead 1 extends obliquely inwardly from its root. The second end 12 is then bent inwardly to provide an upwardly inclined portion 12b at its extremity. With such a structure, the same advantages as those described with reference to FIG. 3a can be obtained. Moreover, since a wedge shaped space is defined between the inclined portion 12b and the board, it is possible to provide a sufficient solder fillet 7.

In the example shown in FIG. 3c, the second end 12 of each lead 1 is bent in the same manner as shown in FIG. 3a. Further, in this example, a spacer 5 is interposed between the horizontal portion 12a of each lead and the lower surface of the casing (lower surface of the light-permeable resin). Such a structure provides the above-described advantages of the spacer 5 while also providing the same advantages as described with reference to FIG. 3a.

Figure 4:
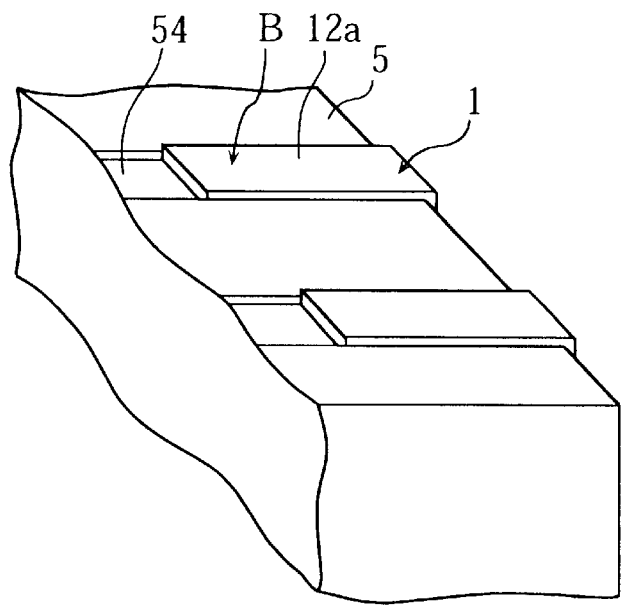
FIG. 4 illustrates a modification of the spacer of the light emitting display device as shown in FIG. 1.

FIG. 4 illustrates an example in which the spacer 5 has a bottom surface which is formed with grooves 54 each for receiving the second end 12 of a corresponding lead 1. The provision of such grooves facilitates the step of bending the second ends 12 of the leads. Moreover, the second ends 12 of the leads will have higher planarity on a board so that mounting of the device by reflow soldering can be carried out in a more stable manner.

Figure 5:
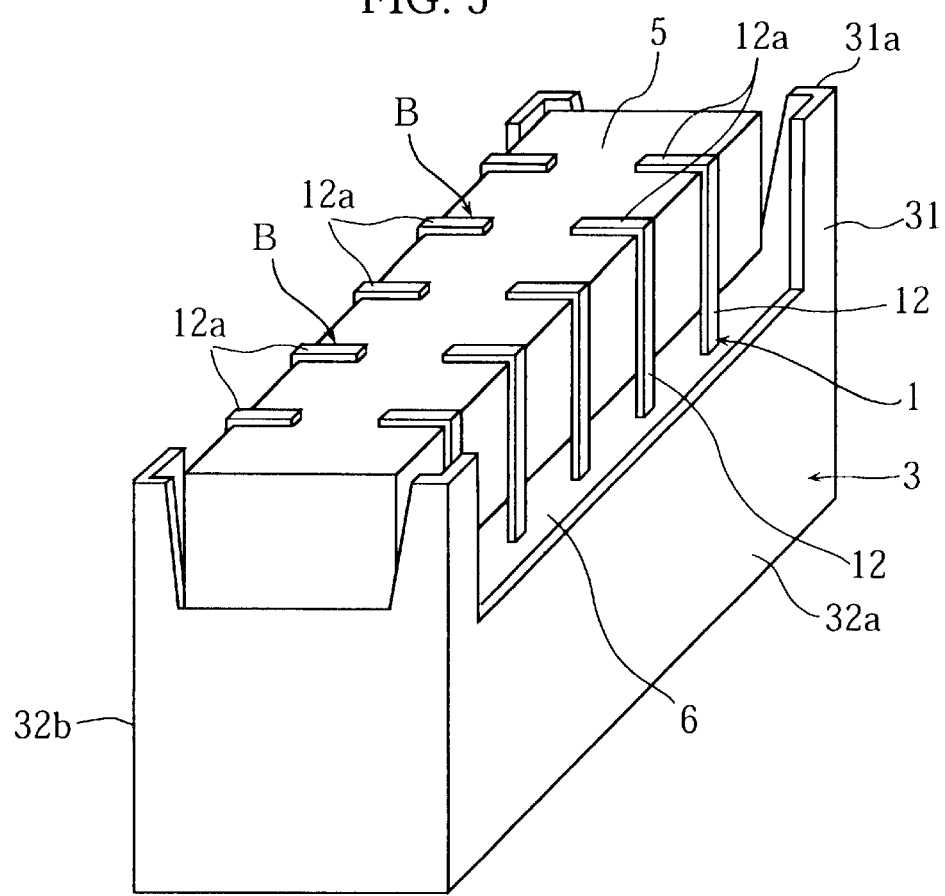
FIG. 5 illustrates another embodiment of light emitting display device according to the present invention.

FIG. 5 illustrates another example of lead arrangement. In this example, again, the leads 1 are arranged in two rows respectively extending along the side walls 32a opposing widthwise of the casing 2. In this example, however, the leads 1 constituting one row are positionally deviated, in the longitudinal direction of the casing 3, from the leads 1 constituting the other row. As a result, the bends 12a of the second ends 12 do not face each other. Therefore, it is possible to avoid shorting between solders applied on the bends (soldering surfaces) 12a during reflow soldering. Such an arrangement of leads can be employed also in the case where a spacer 5 is not provided.

Figure 6A:
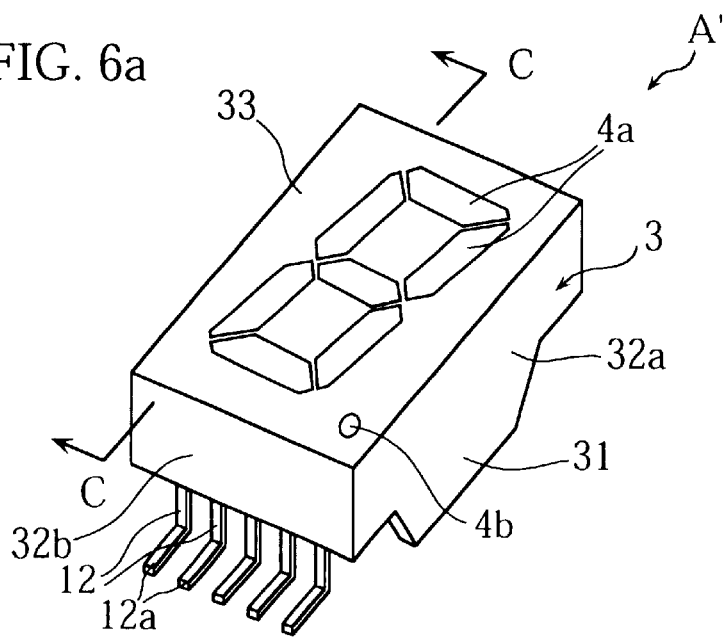
FIGS. 6a~6c illustrate a further embodiment of light emitting display device according to the present invention.
Figure 6B:
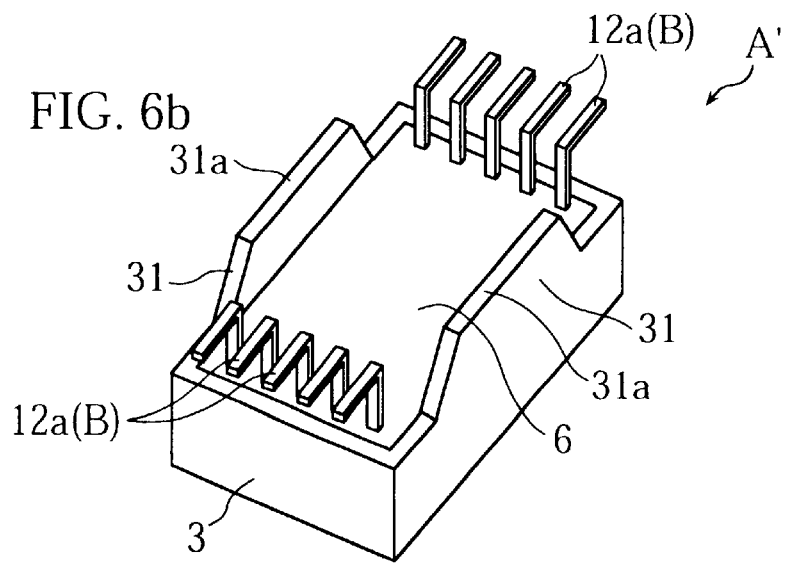
Figure 6C:
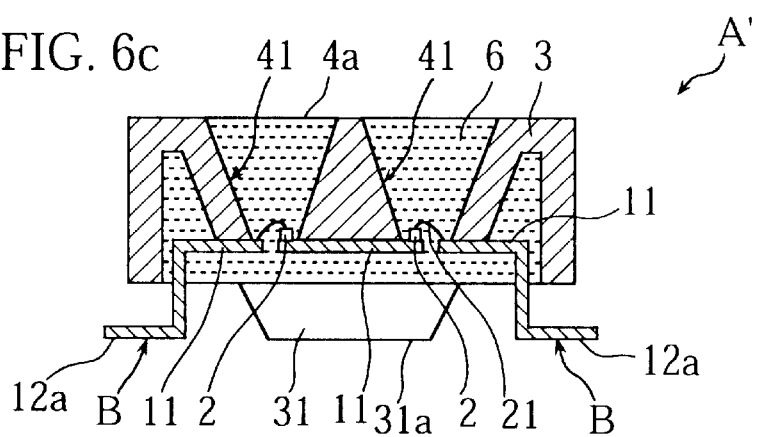

FIGS. 6a~6c illustrate a light emitting display device A' in accordance with a second embodiment of the present invention. The light emitting display device A' comprises a casing 3 and a plurality of leads 1 extending out at the rear side of the casing. The casing 3 is a downwardly open box which includes an elongate rectangular display surface 33 and four side walls 32a, 32b extending downwardly from the four sides of the display surface 33, respectively. The casing 3 is formed with a leg 31 at each of widthwise opposite side walls 32a (side walls extending longitudinally of he casing 3). The legs 31 are equal in height and have bottom surfaces 31a which define the bottom surface of the casing. The casing 3 may be formed by molding white heat-resistant resin having a good light reflectance.

The display surface 33 of the casing is formed with a plurality of light emitting portions 4a, 4b. In the present embodiment, a so-called eight-segment display device is provided in which seven display segments 4a are bars arranged so as to define a numeral 181, and one display segment 4b is a dot for display of a decimal point.

Specifically, as clearly shown in FIG. 6c, each of the display segments 4a, 4b comprises a light guide 41 penetrating through the casing 3 to have an upper opening at the display surface 33 and filled with light-permeable resin 6, and an LED chip 2 arranged at the bottom of the light guide 41 as a light emitting element. Light emitted from the LED chip 2 travels through the light-permeable resin 6 and emitted to the outside at the respective display segment 4a, 4b. As a result, the display segment 4a, 4b is held illuminated when viewed from the outside.

The LED chips 2 are electrically connected to first ends 11 of the leads 1, respectively. Specifically, each of the LED chips 2 is bonded directly on a first end 11 of a lead 1 and is wire-bonded to a first end 11 of another lead 1. The leads 1 are obtained from a leadframe 10 (See FIG. 7), and the first ends 11 of the leads extend horizontally under the light guides 41. Each of the leads 1 is bent, at a portion adjacent a corresponding side wall of the casing 3, substantially vertically so as to extend downwardly. The downwardly extending portion serves as a second end 12 of the lead. To provide an eight-segment display device, eight LED chips need to be provided in corresponding relationship to the display segments 4a, 4b. Each of the LED chips needs to be electrically connected to an anode lead and a cathode lead. One of the anode lead and the cathode lead may be commonly usable for other LED chips. Therefore, there must be at least nine leads 1 to provide a corresponding number of second ends 12. In the illustrated embodiment, ten leads 1 are extended out of the casing 3 to provide ten second ends 12 arranged in two rows extending along and inwardly from the longitudinally opposite side walls 32b (extending widthwise) of the casing 1, each row including five second ends.

The horizontal first ends 11 of the leads 1, the LED chips 2 bonded on the first ends, and the bonding wires 21 are sealed in the light-permeable resin 6 which is filled in the light guides 41. The second ends 12 of the leads 1 project downwardly from the lower surface of the light-permeable resin 6.

The second end 12 of each lead 1 is formed with a soldering surface B which is located substantially flush with the bottom surface of the casing 1 defined by the bottom surfaces 31a of the legs 31. The soldering surface B may have any configuration which is suitable for soldering onto a board by reflow soldering. In the present embodiment, the vertically extending second end 12 of each lead is bent perpendicularly outward to provide a horizontally extending bend 12a. The lower surface of the bend serves as the soldering surface B.

In the light emitting display apparatus A' in this embodiment, the leads are disposed in two rows respectively extending along and inward from side walls 32b opposing longitudinally of the casing 3, whereas each of the side walls 32a opposing widthwise of the casing 3 is formed with a leg 31, as described above. As a result, a space is defined between the bottom surface of each of the longitudinally opposite side walls 32b and the board. Therefore, the second end 12 of each lead 1 can be bent perpendicularly outwardly without hindrance to provide the bend 12a extending outwardly from the casing 3, as shown in FIG. 3c. As a result, a soldering surface B of a sufficient size is provided.

The light emitting display device A' described above with reference to FIGS. 6a~6cmay be manufactured in the following manner.

Figure 7:
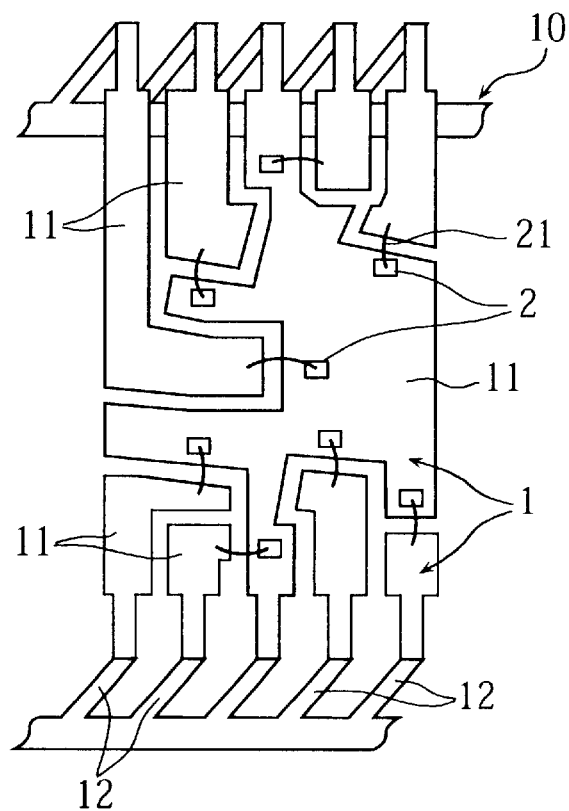
FIG. 7 illustrates a leadframe used for making the light emitting display device shown in FIG. 1.
Figure 8:
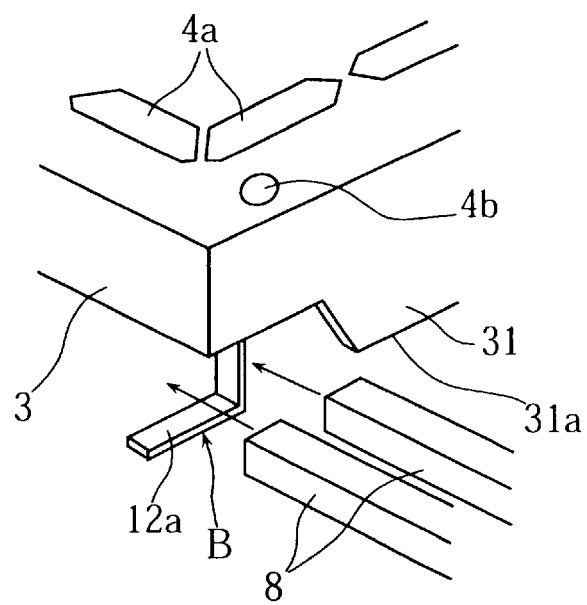
FIG. 8 illustrates a step for bending a lead in making the light emitting display device as shown in FIG. 2.

Firstly, a leadframe as shown in FIG. 7 is prepared which includes groups of leads 1 which provide horizontal first ends 11 and vertical second ends 12. Each group of leads 1 is allocated to one light emitting display device, and a plurality of such lead groups repeat longitudinally of the leadframe. While transferring the leadframe, LED chips are mounted on and wire-bonded to the first ends 11 of the leads, thereby connecting each LED chip to an anode and a cathode. Then, a casing 3 having the structure described above is disposed over each group of leads allocated to one light emitting display device. Then, after a tape is applied onto the front surface of the casing 3 for prevention of resin leakage and the leadframe is turned over, a predetermined amount of light-permeable resin 6 in a fluid state is injected into the casing 3 and hardened. As a result, the light guides 41 formed in the casing 3 are filled with the light-permeable resin 6, and the first ends 11 of the leads 1, the LED chips 2 and the bonding wires 21 are sealed in the light-permeable resin 6. Then, the leads 1 are separated from the leadframe to provide an intermediate product of light emitting display device. Subsequently, the second end 12 of each lead 1 is bent perpendicularly outwardly using a bending jig 8 as shown in FIG. 8 to provide a light emitting display device as shown in FIGS. 6a~6c. The bending jig 8 controls the position at which the leads 1 are bent. The tape is removed at any time after the light-permeable resin is hardened. Since the light emitting display device A' can be made using the leadframe 10, the manufacturing steps are simplified, which leads to a cost reduction.

Figure 15:
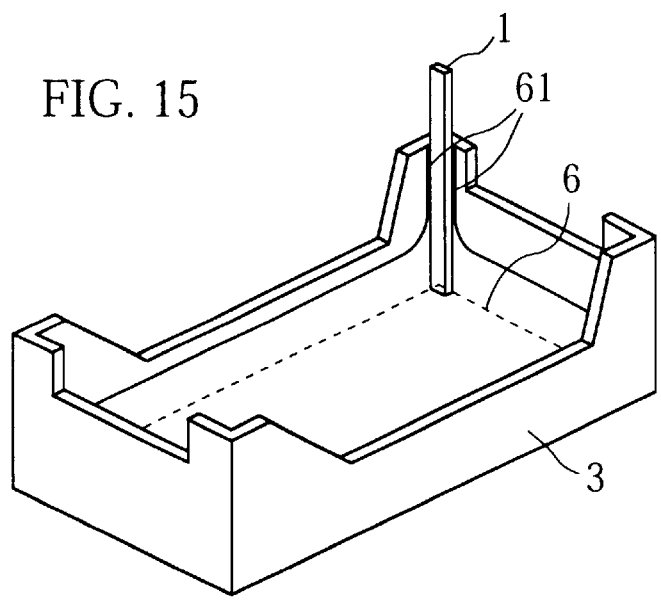
FIG. 15 illustrates a problem which is caused if a leg is provided adjacent to a lead in an embodiment of the present invention.
Figure 16:
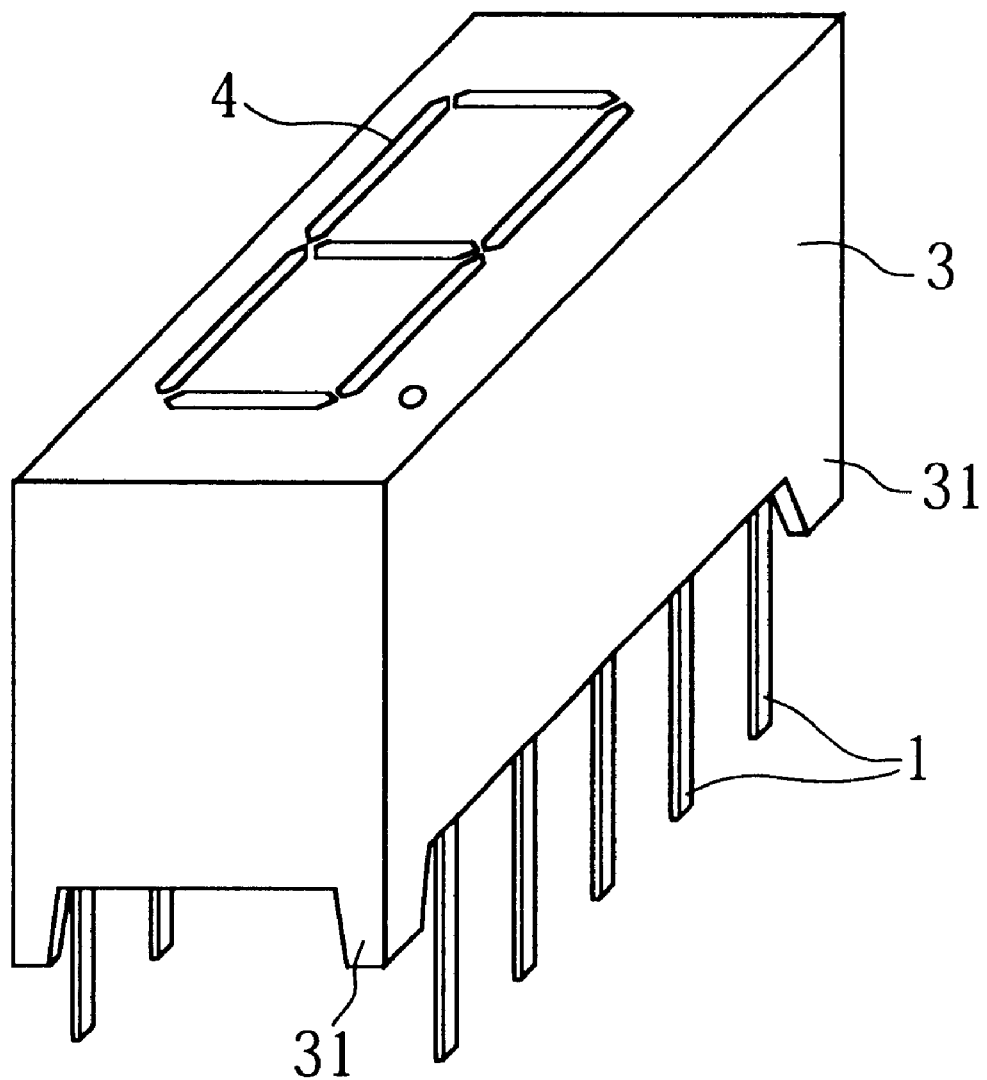
FIG. 16 is an overall perspective view of an example of prior-art light emitting display device.

In this embodiment, each of the side walls 32a opposing widthwise of the casing 3 is formed with a leg 31 which determines the height of the casing. As a result, each of the side walls 32b opposing longitudinally of the casing has such an appearance that its lower portion is cut away. Therefore, during the injection of the light-permeable resin 6, there is no likelihood that the resin rises between each side wall of the casing 3 and the corresponding lead 1 due to capillary action which may lead to unfavorable insulation of the leads. This will be easily understood by comparison with the case shown in FIG. 15 in which a leg 31 is formed close to a lead 1 so that the resin 61 rises between the leg 31 and the lead 1 due to capillary action.

The light emitting display device A' can be easily mounted on a board by so-called reflow soldering. Specifically, a board is used which is initially formed with conductor pads arranged so as to correspond to the soldering surfaces B of the leads 1. Solder paste is applied on each of the conductor pads by printing. After the light emitting display device A' is positionally adjusted in a horizontal plane relative to the board A, the light emitting display device is placed on the board. Then, the board is put in a heating oven. As a result, the solvent in the solder paste is removed while the solder melts and solidifies for adhesion to each of the conductor pads on the board and to a corresponding soldering surface B of the lead. As a result, the soldering surface B of each lead 1 is electrically and mechanically connected to a corresponding conductor pad of the board.

Figure 14A:
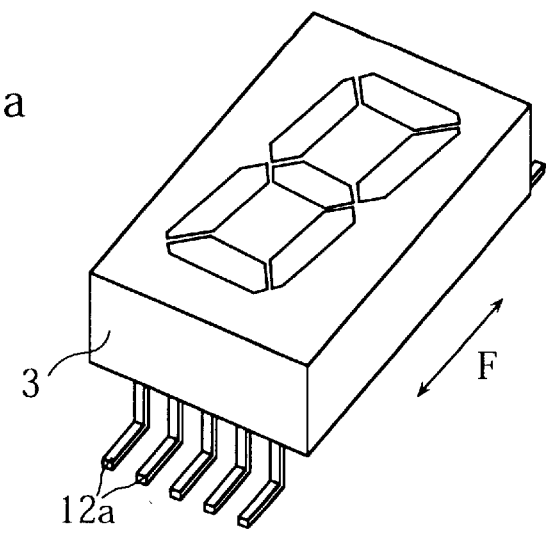
FIGS. 14a and 14b illustrate deformation of the light emitting display device in an embodiment of the present invention when an external force is exerted.
Figure 14B:
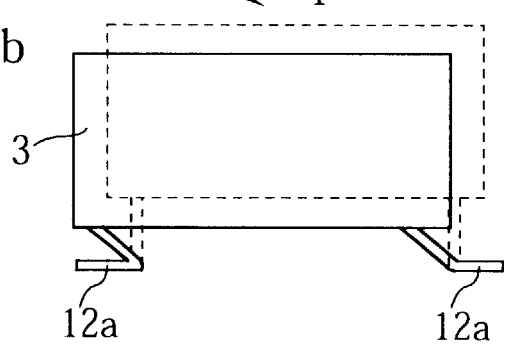

As shown in FIGS. 6a~6c, the leads 1 are arranged in two rows respectively extending along and inwardly from the side walls 32b opposing lengthwise of the casing 3, i.e., extending widthwise of the casing, so that the side walls 32a opposing widthwise of the casing 3, i.e. extending lengthwise of the casing are not formed with anything which protrudes outward from the casing. Therefore, it is possible to mount a plurality of light emitting display devices A' laterally close to each other. When the light emitting display device is mounted on the board, the legs 31 of the casing 3 come into contact with the board. Therefore, an external force in the vertical direction is born by the board via the legs 31. As a result, it is possible to prevent deformation of the leads 1 which may cause a height variation of the casing 3 or breakage of the soldered portions, thereby increasing the mounting stability of the device. This will be easily understood by comparison with the case shown in FIG. 14, in which no legs are provided, and hence an external force F to the casing 3 is exerted on the leads 1, which are therefore deformed, changing the height and position of the casing 3.

By the provision of the legs 31 at the side walls 32a opposing widthwise of the casing 3, space is defined between the board and the side walls 32b opposing longitudinally of the casing 3. Therefore, it is possible to extend the horizontal portion 12a, which is provided by bending each lead outwardly, so as to protrude outwardly from the casing 3. As a result, a soldering surface B of a sufficient size can be provided, which leads to stable soldering. Further, the appearance of the soldered portions can be easily checked, which leads to enhanced reliability of the mounting stability.

In the embodiment shown in FIGS. 6a~6c, a flat soldering surface B, which is defined at the horizontal bend 12a of the second end 12 of each lead 1, may be located slightly lower relative to the bottom surfaces 31a of the legs 31. Such a structure is advantageous because, when the light emitting display device A' is disposed on a board for mounting, each of the soldering surfaces B can be positively brought into contact with a respective conductor pad. Although, in this structure, a slight space is defined between the bottom surface 31a of each leg 31 and the board, the leg 31 easily comes into contact with the board when an external force is exerted on the casing 3. Therefore, there is no likelihood that each of the leads is unfavorably deformed to change the position and posture of the casing.

As described above, the legs 31 should be provided at portions away from the leads 1. Specifically, where the casing 3 is in the form of a rectangular box, the legs 31 should be provided at side walls of the casing 3 at which leads 1 are not arranged at the inside thereof, i.e., at the side walls 32a opposing widthwise of the casing, as are in the embodiment described above. In the case where an external force is unlikely to be applied, no legs need to be provided.

Figure 9A:
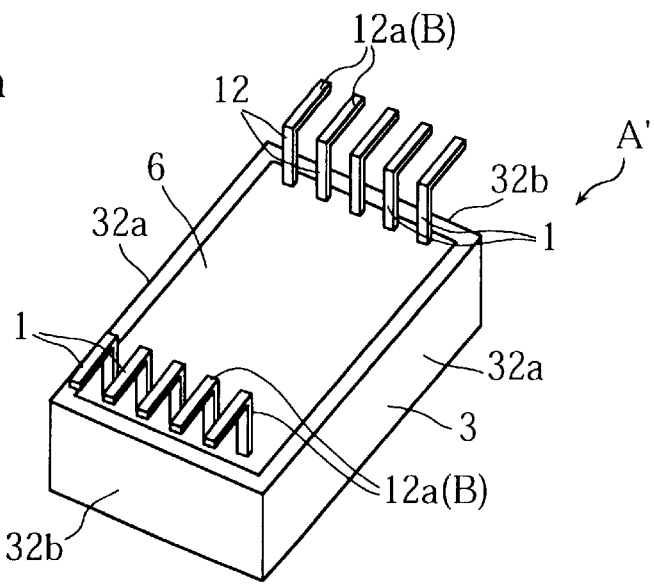
FIGS. 9a~9c illustrate modified legs of the casing.

FIG. 9a illustrates a case in which a casing 3 is not provided with a leg. The casing 3 has a coplanar bottom surface at its circumference. In this case, it is preferable that sufficient space is defined between the bottom surface of the casing 3 and horizontal portions 12a of the leads.

Figure 9B:
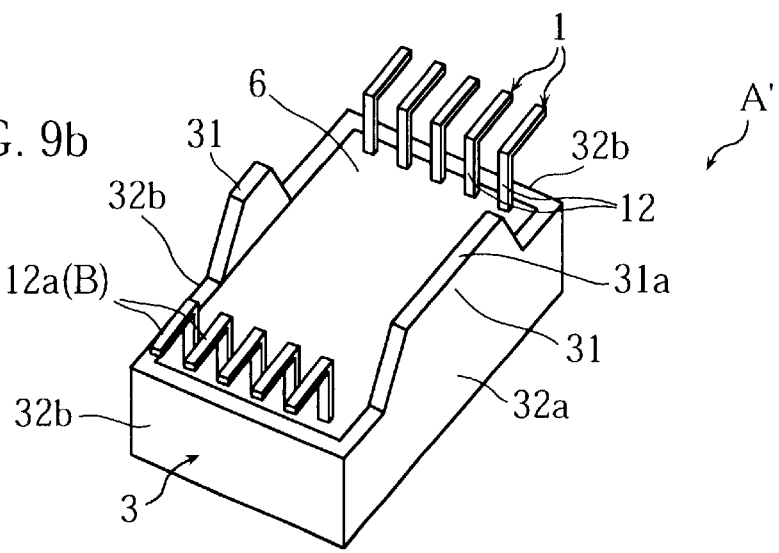

FIG. 9b illustrates a case in which the opposite side walls 32a of the casing 3 are formed with legs 31 which are different in length from each other. The mounting stability on on a board can be obtained if only one of the legs 31 has a certain length. With this structure, since one of the legs 31 is relatively short, the material for forming the casing 3 can be saved. Moreover, sufficient space can be provided for inserting a jig for bending leads 1.

Figure 9C:
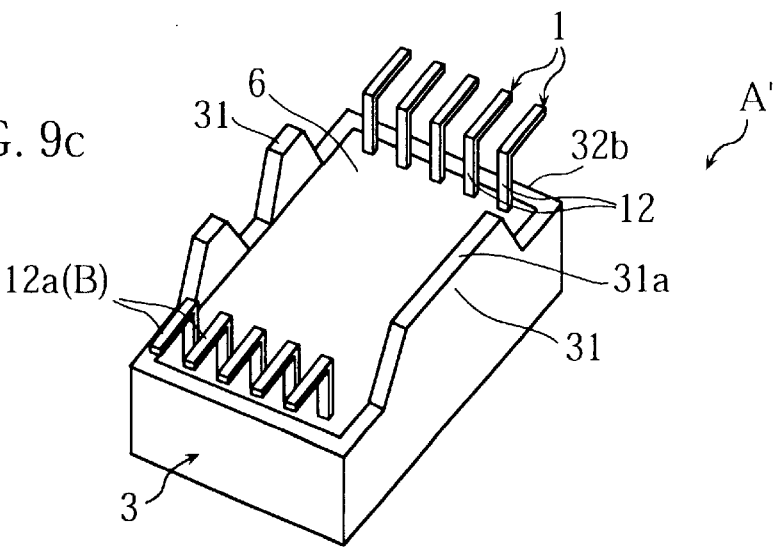

FIG. 9c illustrates another example in which the opposite side walls 32a of the casing 3 are formed with legs 31 which are different in number and configuration from each other. With this structure, the configuration of the casing 3 is asymmetrical so that it is possible to recognize orientation of the casing 3 by checking the configuration or the center of gravity of the casing 3.

Figure 10A:
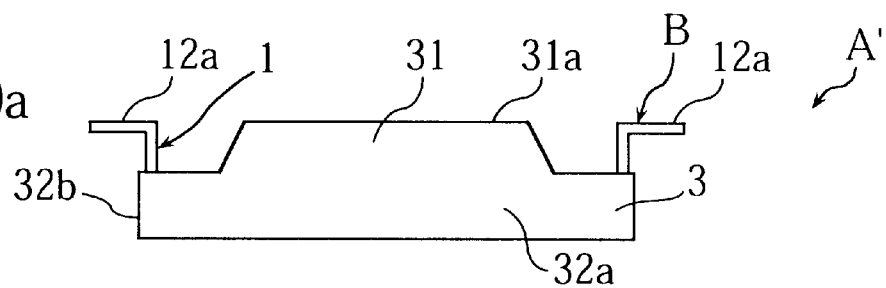
FIGS. 10a~10e illustrate modified bends for ht second end of each lead.

In the embodiment described above or in the case as shown in FIG. 10a, the soldering surface B of the second end 12 is provided by bending the vertical portion of each lead 1 perpendicularly outwardly. However, a soldering surface B of another configuration may be employed.

Figure 10B:
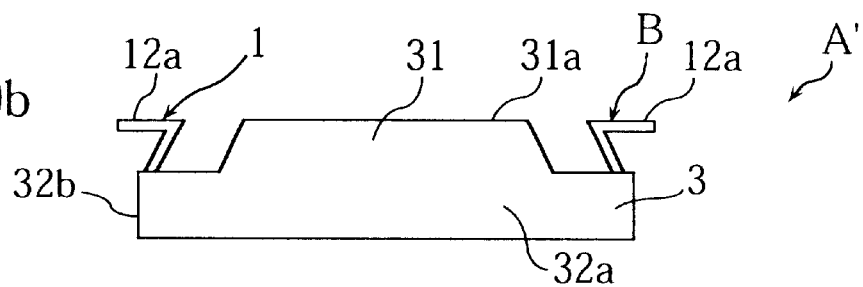
Figure 10C:
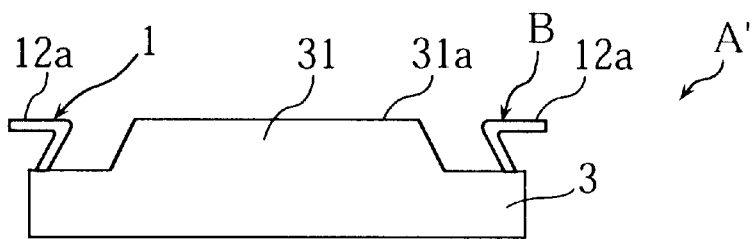

As shown in FIGS. 10b and 10c, each of the leads 1 is bent at its root to extend inwardly of the casing 3 and is then bent again to extend outwardly horizontally. With this structure, it is possible to provide a horizontal bend 12a of a sufficient size while reducing the outwardly protruding amount of the lead 1 from the casing. As a result, it is possible to enhance the space-efficiency on the mounting board. In the example shown in FIG. 10c, the bent portion of the lead is slightly rounded at the outer portion, which contributes to appropriate formation of a solder fillet.

Figure 10D:
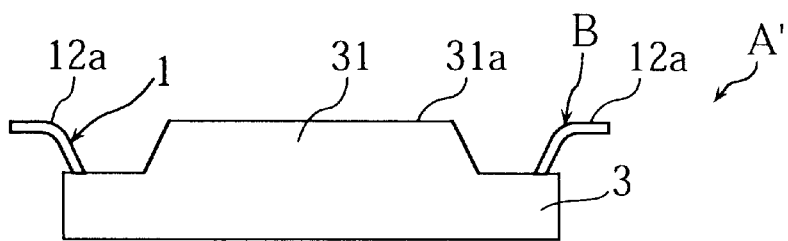
Figure 10E:
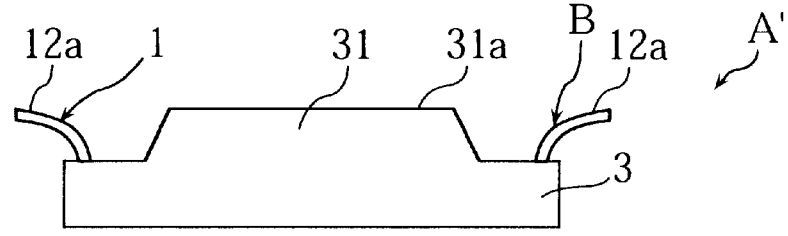

As shown in FIGS. 10d and 10e, each of the leads 1 may be inclined from its root outwardly of the casing 3 and is then bent to extend outwardly horizontally or substantially horizontally. In both cases, the lead is formed with a rounded portion for transition to the horizontal bend 12a. Such a structure also facilitates the formation of a solder fillet.

In the embodiments described above, a soldering surface B to be formed at the second end 12 of each lead 1 is formed by bending the lead 1 outwardly. However, as shown in FIGS. 11a~11f, the lead 1 maybe bent inwardly to provide a soldering surface B.

Figure 11A:
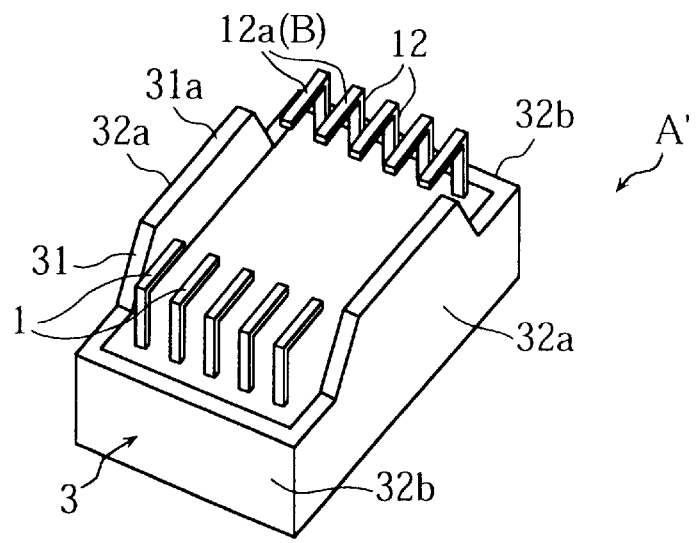
FIGS. 11a~11f illustrate other modified bends for the second end of each lead.
Figure 11B:
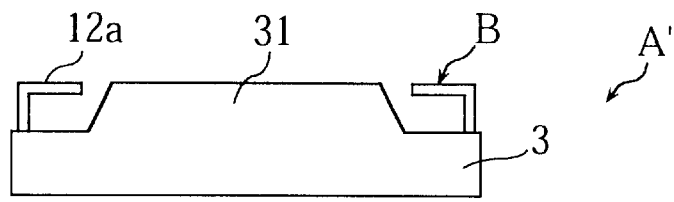

FIGS. 11a and 11b illustrates an example in which each of the lead 1 is bent perpendicularly inwardly. With such a structure, the lead 1 does not protrude outwardly from the casing 3, which leads to enhanced space-efficiency on a mounting board.

Figure 11C:
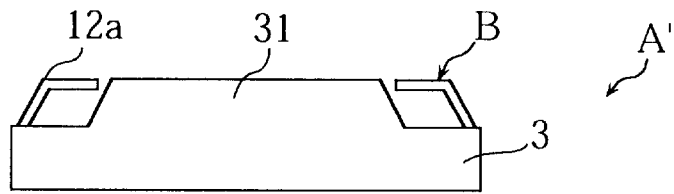
Figure 11D:
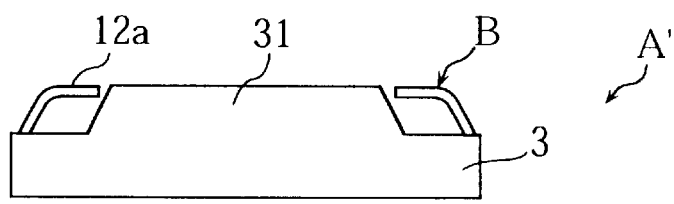
Figure 11E:
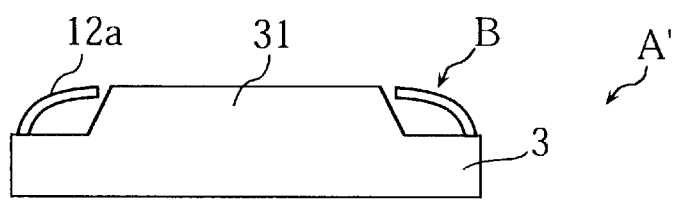

FIGS. 11c~11e illustrate examples in which each of the leads 1 is inclined, from its root, inwardly of the casing 1 and is then bent to extend inwardly horizontally or substantially horizontally to provide a bend 12a at its extremity. The portion continuous to the horizontal or substantially horizontal portion 12a of the lead shown in FIG. 11e is rounded to a greater extent than the same portion of the lead shown in FIG. 11d.

Figure 11F:
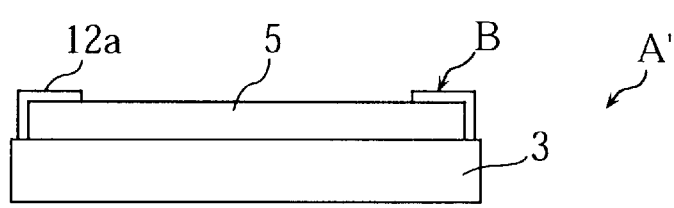
Figure 13A:
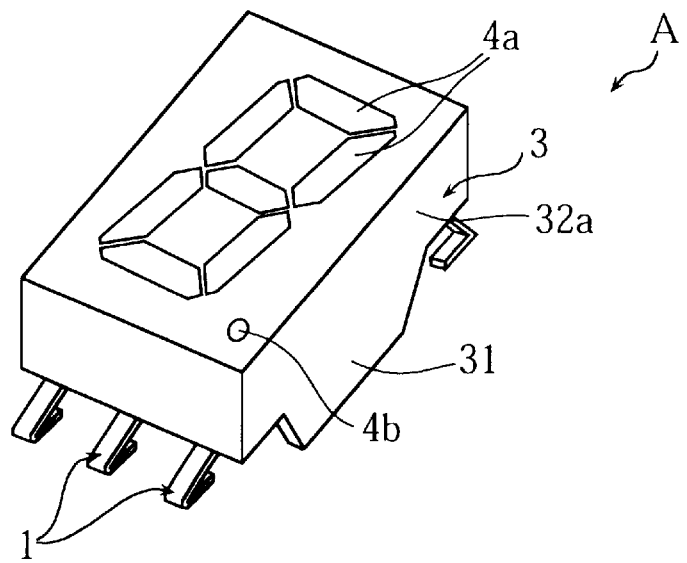
FIGS. 13a~13c illustrate still another embodiment of light emitting display device according to the present invention.
Figure 13B:
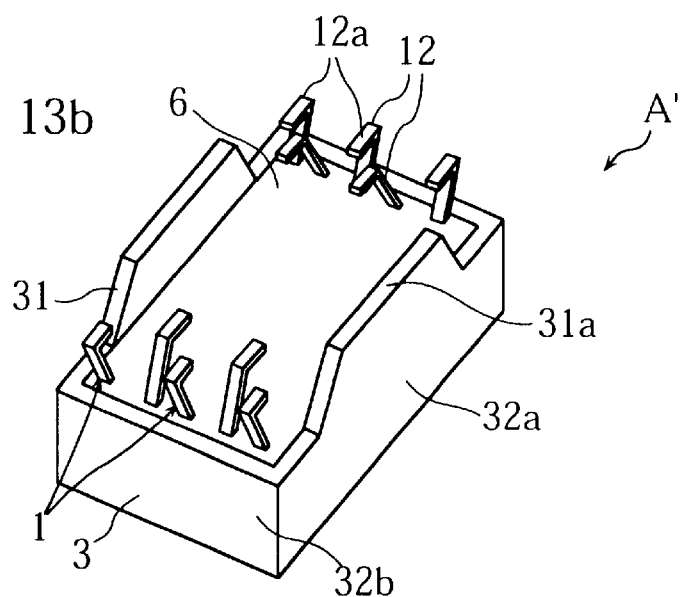
Figure 13C:
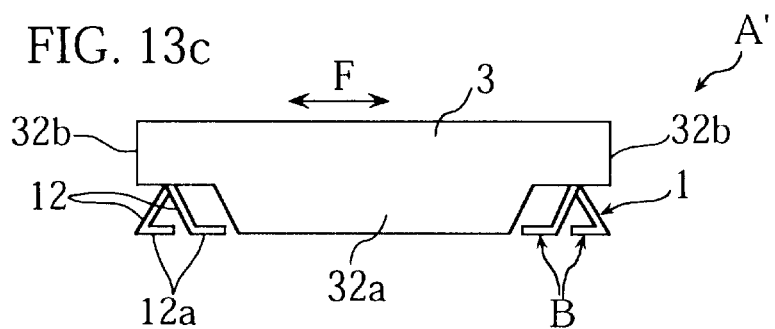

FIG. 11f illustrates an example in which each of the leads 1 is bent perpendicularly inwardly to provide a bend 12a, and a spacer 5 is disposed between the bends 12a and the casing. With such a structure, without forming the legs 31, the leads 1 are prevented from being deformed due to an external force. Moreover, the process for bending the leads 1 during the fabrication can be facilitated.

FIGS. 12a~12c and FIGS. 13a~13c illustrate other examples of bending manner of the leads 1. In each of these examples, two kinds of leads are alternately disposed one of which is inclined outwardly from its root whereas the other of which is inclined inwardly from its root. In the example shown in FIGS. 12a~12c, the lead 1 is formed, at its extremity, with an outwardly extending horizontal bend 12a the lower surface of which serves as a soldering surface B. On the other hand, in the example shown in FIGS. 13a~13c, the lead 1 is formed, at its extremity, with an inwardly extending horizontal bend 12a the lower surface of which serves as a soldering surface B. With this structure, a triangular truss is defined by the combination of adjacent leads 1, casing 3 and the mounting board, so that the bearing capacity of the casing 3 against an external force F is considerably enhanced. Particularly, where each of the leads 1 is inclined at an oblique angle of 30° with respect to the vertical direction, an equilateral triangle truss is defined, which further enhances the bearing capacity of the casing 3 against an external force. Moreover, in the example shown in FIGS. 13a~13c, the leads 1 do not extend outward of the casing 3, which enhances the space-efficiency on the board.

The present invention can be modified in various ways within the scope of the description of the claims, and such modifications are included in the present invention.

What is claimed is:

1. A method of making a light emitting display device comprising: a casing of a predetermined height having an obverse surface, two longitudinally extending side walls and two widthwise extending side walls, the obverse surface being formed with a plurality of display segments each of which is provided at an end of a light guide; a plurality of light emitting elements disposed in the casing so as to positionally correspond to the display segments; a plurality of leads each of which has a first end electrically connected to a respective light emitting element and a second end extending toward a bottom side of the casing; and a resin filled in the light guides for sealing the first ends of the leads and the light emitting elements;

the method comprising the steps of:
(a) bonding the light emitting elements on a leadframe including the leads and performing wire-bonding;
(b) disposing the casing on a leadframe so that the display segments positionally correspond to the light emitting elements;
(c) injecting a transparent resin into the casing for filling the light guides and solidifying the resin for sealing the first ends of the leads, the light emitting elements and bonding wires; and
(d) separating the leads from the leadframe and bending the second end of each lead for forming a soldering surface.

2. The method of making a light emitting display device according to claim 1, wherein, in the step (d), the soldering surface is formed to be substantially flush with a bottom surface of the casing in the height direction of the casing.

3. A light emitting display device comprising: a casing of a predetermined height having an obverse surface formed with a plurality of display segments each of which is provided at an end of a light guide; a plurality of light emitting elements disposed in the casing so as to positionally correspond to the display segments; a plurality of leads each of which has a first end electrically connected to a respective light emitting element and a second end extending toward a bottom side of the casing; and a resin filled in the light guides for sealing the first ends of the leads and the light emitting elements;

wherein the second end of each lead is formed with a soldering surface which is provided in the casing to be substantially flush with a bottom surface of the casing in the height direction of the casing.

4. The light emitting display device according to claim 1, wherein the bottom side of the casing has a peripheral portion formed with a plurality of legs.

5. The light emitting display device according to claim 4, wherein each of the soldering surfaces is formed by bending, at the bottom side of the casing, the second end of a respective lead extending in the height direction of the casing at an acute angle.

6. The light emitting display device according to claim 5, wherein the second end of each lead is bent toward a center of the casing.

7. The light emitting display device according to claim 6, wherein a spacer is interposed between the resin and the second end of each lead.

8. The light emitting display device according to claim 3, wherein the second end of each lead is formed with a flat portion which is substantially flush with the bottom surface of the casing in the height direction of the casing, the second end being bent to define an obtuse angle at one end of the flat portion and/or at the other end of the flat portion.

9. The light emitting display device according to claim 3, wherein the plurality of leads are arranged in two rows extending along opposite sides of the casing, the leads in one of the rows positionally deviating from the leads in the other row in the direction in which the rows extend.

10. A light emitting display device comprising: a casing having a predetermined height, the casing including an obverse surface, two longitudinally extending side walls and two widthwise extending side walls, the obverse surface being formed with a plurality of display segments each of which is provided at an end of a light guide; a plurality of light emitting elements disposed in the casing so as to positionally correspond to the display segments; a plurality of leads each of which has a first end electrically connected to a respective light emitting element and a second end extending toward a bottom side of the casing; and a resin filled in the light guides for sealing the first ends of the leads and the light emitting elements; the light emitting display device being used in combination with other light emitting display device or devices arranged in side-by-side relationship;

wherein the plurality of leads are arranged in two rows extending along the two widthwise extending side walls, the second end of each lead being formed with a soldering surface.

11. The light emitting display device according to claim 10, wherein the soldering surface is substantially flush with a bottom surface of the casing in the height direction of the casing.

12. The light emitting display device according to claim 10, wherein the casing is rectangular or substantially rectangular in plan view.

13. The light emitting display device according to claim 10, wherein each of the longitudinally extending side walls is formed with a leg.

14. The light emitting display device according to claims 11, wherein the soldering surface is formed by bending the second end of each lead.

15. The light emitting display device according to claim 14, wherein the soldering surface is located slightly lower than a bottom surface of the casing.

16. The light emitting display device according to claim 14, wherein the soldering surface is formed by bending the second end of each lead inwardly, and wherein a spacer is interposed between the resin and the second end of each lead.

17. The light emitting display device according to claim 10, wherein the leads are bent so that portions of the leads extending outward from the resin are inclined alternately in opposite directions.

* * * * *